(12) United States Patent
Yazdani et al.

(10) Patent No.: US 9,613,905 B2
(45) Date of Patent: *Apr. 4, 2017

(54) ELECTRONIC INTERCONNECTS AND DEVICES WITH TOPOLOGICAL SURFACE STATES AND METHODS FOR FABRICATING SAME

(71) Applicant: The Trustees of Princeton University, Princeton, NJ (US)

(72) Inventors: Ali Yazdani, Princeton, NJ (US); N. Phuan Ong, Belle Mead, NJ (US); Robert J. Cava, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/919,008

(22) Filed: Oct. 21, 2015

(65) Prior Publication Data

US 2016/0043033 A1 Feb. 11, 2016

Related U.S. Application Data

(63) Continuation of application No. 13/039,762, filed on Mar. 3, 2011, now Pat. No. 9,331,020.
(Continued)

(51) Int. Cl.
*H01L 29/76* (2006.01)
*H01L 23/532* (2006.01)
(Continued)

(52) U.S. Cl.
CPC ........ *H01L 23/53209* (2013.01); *C22C 28/00* (2013.01); *C22C 30/00* (2013.01);
(Continued)

(58) Field of Classification Search
CPC . H01L 2924/01051; H01L 2924/01052; H01L 35/18
See application file for complete search history.

(56) References Cited

U.S. PATENT DOCUMENTS 4,497,973 A * 2/1985 Heath ............... H01L 35/32
136/205
9,170,228 B2 * 10/2015 Takulapalli ........ G01N 27/4145
(Continued)

OTHER PUBLICATIONS

B. Lenoir, A. Dauscher, M. Cassart, Y. I. Ravich, and H. Scherrer, "Effect of Antimony Contents on the Thermoelectric Figure of Merit of Bi1—xSbx," Journal of Physics and Chemistry of Solids, vol. 59. pp. 129-134 (1998).
(Continued)

*Primary Examiner* — Zandra Smith
*Assistant Examiner* — John M Parker
(74) *Attorney, Agent, or Firm* — Meagher Emanuel Laks Goldberg & Liao, LLP

(57) ABSTRACT

An interconnect is disclosed with enhanced immunity of electrical conductivity to defects. The interconnect includes a material with charge carriers having topological surface states. Also disclosed is a method for fabricating such interconnects. Also disclosed is an integrated circuit including such interconnects. Also disclosed is a gated electronic device including a material with charge carriers having topological surface states.

21 Claims, 5 Drawing Sheets

Related U.S. Application Data

(60) Provisional application No. 61/368,552, filed on Jul. 28, 2010.

(51) Int. Cl.
| | |
|---|---|
| H01L 29/786 | (2006.01) |
| H01L 21/768 | (2006.01) |
| C22C 28/00 | (2006.01) |
| C22C 30/00 | (2006.01) |
| H01L 29/78 | (2006.01) |

(52) U.S. Cl.
CPC .. *H01L 21/76838* (2013.01); *H01L 23/53271* (2013.01); *H01L 29/78* (2013.01); *H01L 29/78681* (2013.01); *H01L 2924/0002* (2013.01); *H01L 2924/01051* (2013.01); *Y10T 29/49204* (2015.01)

(56) References Cited

U.S. PATENT DOCUMENTS

| | | | | |
|---|---|---|---|---|
| 2001/0019037 | A1* | 9/2001 | Zakhidov | B82Y 20/00 216/56 |
| 2002/0014261 | A1* | 2/2002 | Caillat | H01L 35/04 136/205 |
| 2002/0033188 | A1* | 3/2002 | Shakouri | H01L 29/205 136/201 |
| 2002/0189661 | A1* | 12/2002 | Caillat | H01L 35/04 136/236.1 |
| 2003/0016619 | A1* | 1/2003 | Judge | G11B 7/003 369/287 |
| 2003/0041892 | A1* | 3/2003 | Fleurial | H01L 35/16 136/227 |
| 2005/0269611 | A1* | 12/2005 | Van Der Sluis | G11C 11/22 257/295 |
| 2006/0011942 | A1* | 1/2006 | Kim | H01L 45/04 257/192 |
| 2006/0118853 | A1* | 6/2006 | Takata | H01L 29/42332 257/314 |
| 2006/0137732 | A1* | 6/2006 | Farahani | H01L 23/38 136/201 |
| 2006/0234505 | A1* | 10/2006 | Asano | B82Y 10/00 438/688 |
| 2011/0135960 | A1* | 6/2011 | Casper | H01F 1/408 428/810 |
| 2011/0220166 | A1* | 9/2011 | Vidu | B82Y 10/00 136/240 |
| 2011/0281070 | A1* | 11/2011 | Mittal | H01L 31/02246 428/142 |
| 2012/0138115 | A1* | 6/2012 | Chen | H01L 35/32 136/205 |

OTHER PUBLICATIONS

CRC Handbook of Thermoelectrics, Chapter 5, CRC Press, Inc., 1995.
Roushan et al., "Topological surface states protected from backscattering by chiral spin texture", Nature, Aug. 27, 2009, vol. 460, pp. 1106-1110.
Seo et aL, "Transmission of topological surface states through surface barriers", Nature, Jul. 15, 2010, vol. 466, pp. 345-346.
Franz, "U-turns strictly prohibited", Nature Jul. 15, 2010, vol. 466, pp. 323-324.
Qu et aL, "Quantum Oscillations and Hall Anomaly of Surface States in the Topological Insulator Bi2Te3", Princeton University, Mar. 17, 2010, pp. 1-14.
Qu et aL, "Supporting Online Material: Quantum Oscillations and Hall Anomaly of Surface States in the Topological Insulator Bi2Te3", Princeton University, Jul. 13, 2010, pp. 1-5.
Witze, "Physics on the edge", Science News, May 22, 2010, vol. 177 #11, pp. 22-27.
Qi et aL, "The quantum spin Hall effect and topological insulators", Physics Today, Jan. 2010, pp. 33-38.
Hasan et aL, "Topological Insulators", arXiv:1002.3895v1 [cond-matmes-hall], Feb. 20, 2010, pp. 1-23.
Kane, C.L. & Mele, E.J., "Topological Order and the Quantum Spin Hall Effect", Physical Review Letters, 95, 146802 (2005).
Fu et al., "Topological Insulators in Three Dimensions", Physical Review Letters, 98, 106803 (2007).
Moore, J.E. & Balents, L., "Topological Invariants of Time-Reversal-Invariant Band Structures", Physical Review B, 75, 121306R (2007).
Roy, R. "Z2 Classification of Quantum Spin Hall Systems: An Approach Using Time-Reversal Invariance", Physical Review B, 79, 195321 (May 21, 2009).
Bernevig et al., "Quantum Spin Hall Effect and Topological Phase Transition in HgTe Quantum Wells", Science, Dec. 15, 2006, vol. 314, pp. 1757-1761.
Konig et al., "Quantum Spin Hall Insulator State in HgTe Quantum Wells", Science, Nov. 2, 2007, vol. 318, pp. 766-770.
Zhang et al., "Topological Insulators in Bi2Se3, Bi2Te3, and Sb2Te3 with a single Dirac Cone on the Surface", Nature Physics, Jun. 2009, vol. 5, pp. 438-442.
Hsieh et al., "Observation of Unconventional Quantum Spin Textures in Topological Insulators", Science, Feb. 13, 2009, vol. 323, pp. 919-922.
Hseih et al., "A Topological Dirac Insulator in a Quantum Spin Hall Phase", Nature 06843, Apr. 24, 2008, vol. 452, pp. 970-975.
Chen et al., "Experimental Realization of a Three-Dimensional Topological Insulator, Bi2Te3", Science, Jul. 10, 2009, vol. 325, pp. 178-181.
Guo H.M. & Franz, M "Theory of Quasiparticle Interference on the Surface of a Strong Topological Insulator", Physical Review B, 81, 041102R (Jan. 1, 2010).
Zhou et al., "Theory of Quasiparticle Scattering in a Two-Dimensional System of Helical Dirac Fermions: Surface Band Structure of a Three-Dimensional Topological Insulator", Physical Review B, 80, 245317 (Dec. 18, 2009).
Avouris, P. & Lyo, I., "Observation of Quantum-Size Effects at Room Temperature on Metal Surfaces with STM", Science, May 13, 1994, vol. 264, pp. 942-945.
Alpichshev et al. "STM Imaging of Electronic Waves on the Surface of Bi2Te3: Topologically Protected Surface States and Hexagonal Warping Effects", Physical Review Letters, 104, 016401 (2010).
Zhang et al, "Experimental Demonstration of Topological Surface States Protected by Time-Reversal Symmetry", Physical Review Letters, 103, 266803 (Dec. 23, 2009).
Burgi et al., "Probing Hot-Electron Dynamics at Surfaces with a Cold Scanning Tunneling Microscope", Physical Review Letters, vol. 82, No. 22. (1999).
Burgi et al., "Confinement of Surface State Electrons in Fabry-Perot Resonators", Physical Review Letters, vol. 81, No. 24, (1998).
Crommie et al., "Imaging Standing Waves in a Two-Dimensional Electron Gas", Nature, Jun. 10, 1993, vol. 363, pp. 524-527.
Mugarza et al., "Lateral Quantum Wells at Vicinal Au(111) Studied with Angle-Resolved Photoemission", Physical Review B, 66, 245419 (2002).
Pivetta et al., "Reading the Ripples of Confined Surface-State Electrons; Profiles of Constant Integrated Local Density of States", Physical Review B, 67, 193402 (2003).
Li et al., "Electron Confinement to Nanoscale Ag Islands on Ag(111); A Quantitative Study" Physical Review Letters, Apr. 13, 1998, vol. 80, No. 15, pp. 3332-3335.
Heller et al., "Scattering and Absorption of Surface Election Waves in Quantum Corrals", Nature, Jun. 9, 1994, vol. 369, pp. 464-466.
Fiete, G. & Heller, E., "Colloquium: Theory of Quantum Corrals and Quantum Mirages", Reviews of Modern Physics, Jul. 2003, vol. 75, pp. 933-948.
Teo et al. "Suface States and Topological Invariants in Three-Dimensional Topological Insulators: Application to B1—xSbx", Physical Review B, 78, 045426 (2008).
Wolf et al. "Spintronics: A Spin-Based Electronics Vision for the Future", Science, Nov. 16, 2001, vol. 294, pp. 1488-1495.

(56) References Cited

OTHER PUBLICATIONS

Leek et al., "Observation of Berry's Phase in a Solid State Qubit", Science, Dec. 21, 2007, vol. 318, pp. 1889-1892.

Lashell et al. "Spin Splitting of an Au(111) Surface State Band Observed with Angle Resolved Photoelection Spetroscopy", Physical Review Letters, Oct. 14, 1996, vol. 77, No. 16, pp. 3419-3422.

Peterson et al. "Direct Imaging of the Two-Dimensional Fermi Contour: Fourier-Transform STM", Physical Review B, Mar. 15, 1998, vol. 57, No, 12.

Hoffman et al., "Imaging Quasiparticle Interference in Bi2Sr2CaCu2O8+ . . . " Science, Aug. 16, 2002, vol. 297, pp. 1148-1151.

Markiewics, "Bridging k and q Space in the Cuprates: Comparing Angle-Resolved Photoemission and STM results", Physical Review B, 69, 214517 (2004).

McElroy et al. "Elastic Scattering Susceptibility of the High Tempeaure Superconductor Bi2Sr2CaCu2O8+ . . . ", Physical Review, 96, 06705 (2006).

Peterson, L. & Hedegard, P., "A Simple Tight-Binding Model of Spin Orbit Splitting of sp-Derived Surface States", Surface Science, vol. 459, pp. 49-56 (2000).

Pasqual et al., "Role of Spin in Quasiparticle Interference", Physical Review Letters, vol. 93, No. 19, (2004).

Kim et al., "Evidence Against a Charge Density Wave on Bi(111)", Physical Review B, 72, 085440 (2005).

Brihuega et al. "Quasiparticle Chirality in Epitaxial Graphene Probed at the Nanometer Scale", Physical Review Letters, 101, 206802 (2008).

Rutter et al., "Scattering and Interference in Epitaxial Graphene", Science, Jul. 13, 2007, vol. 317, pp. 219-222.

Mikitik, G. & Sharlai, Y., "Manifestation of Berry's Phase in Metal Physics", Physical Review Letters, vol. 82, No. 10 (1999).

Ong, "Geometric Interpretation of the Weak-Field Hall Conductivity in Two-Dimensional Metals with Arbitrary Fermi Surface", Physical Review B, vol. 43, No. 1 (1991).

Qi et al., "Topological Field Theory of Time-Reversal Invariant Insulators", Physical Review B, 78, 195424 (2008).

Xia et al. "Observation of a Large-Gap Topological-Insulator Class with a Single Dirac Cone on the Surface", Nature Physics, vol. 5, pp. 398-402 (1999).

Checkelsky et al. "Quantum Interference in Macroscopic Cystals of Nonmetallic Bi2Se3", Physical Review Letters, 103, 246601 (Dec. 11, 2009).

Taskin, A. & Ando, Y., "Quantum Oscillations in the Topological Insulator Bi1—xSbx", Physical Review B, 80, 085203 (2009).

Novoselov et al., "Two-Dimensional Gas of Massless Dirac Fermions in Graphene", Nature, Nov. 10, 2005, vol. 438, pp. 197-200.

Zhang et al., "Electronic Structures and Surface States of the Topological Insulator Bi1—xSbx", Physical Review B, 80, 085307 (Aug. 13, 2009).

Li, Y. et al., "Growth Dynamics and Thickness-Dependent Electronic Structure of Topological Insulator Bi2Te3 Thin Films on Si", Preprint at (http://arxiv.org/abs/0912.504v1) (Dec. 27, 2009).

Biswas et al., "Scattering from Surface Step Edges in Strong Topological Insulators", Preprint at (http://arxiv.org/abs/0912.4477v2) (Mar. 29, 2010).

Gomes et al. "Quantum Imaging of Topologically Unpaired Spin-Polarized Dirac Fermions", Preprint at (http://arxiv.org/abs/0909.0921v2) (Sep. 4, 2009).

Gusynin, V. & Sharapov, S., "Magnetic Oscillations in Planar Systems with the Dirac-Like Spectrum of Quasiparticle Excitations", Physical Review B, 71, 125124 (2005).

\* cited by examiner

ELECTRONIC INTERCONNECTS AND DEVICES WITH TOPOLOGICAL SURFACE STATES AND METHODS FOR FABRICATING SAME

CROSS REFERENCE TO RELATED APPLICATIONS

This application claims the benefit of U.S. Provisional Application No. 61/368,552, filed on Jul. 28, 2010 and U.S. patent application Ser. No. 13/039,762, filed Mar. 3, 2011 which are both incorporated herein by reference as if fully set forth.

STATEMENT REGARDING FEDERALLY SPONSORED RESEARCH OR DEVELOPMENT

This invention was made with government support under Grants #DMR-0704314 and #DMR-0819860 awarded by the National Science Foundation; Grant #N00014-07-1-0348 awarded by the Office of Naval Research; Grant #DE-FG02-07ER46419 awarded by the Department of Energy and Grant #W911NF-07-1-0125 awarded by the Army Research Office. The government has certain rights in this invention.

FIELD OF INVENTION

This is directed toward electronic device fabrication.

BACKGROUND

One of the challenges in reducing the size of electronic devices is associated with the resistance of the metallic interconnects that are used in today's integrated circuits. Current technology relies on the use of metal interconnects exhibiting normal electrical resistance. These interconnects show an increase in their resistance when fabricated with a dimension below about 20 nm. A significant contribution to this resistance is associated with scattering of charge carriers at the surface of the interconnects. This surface contribution naturally becomes more significant as the size of the interconnects decreases. This is because as the size decreases a larger fraction of the charge carriers are at or near a surface.

SUMMARY

An interconnect with enhanced immunity of electrical conductivity to defects is described. The interconnect is fabricated using a material with charge carriers having topological surface states. A method for fabricating such interconnects is also described. An integrated circuit including such interconnects and a gated electronic device including a material with charge carriers having topological surface states are also described.

DETAILED DESCRIPTION

Recently, materials have been fabricated in which charge carriers, such as electrons, move in topological surface states. What distinguishes these states from previously known charge carrier states is that topological surface states depend on the spin of the charge carrier, in addition to its charge and mass. Like charge and mass, spin is an inherent property of a charge carrier such as an electron. It has units of angular momentum and may be described using quantum-mechanical vector concepts. In a topological surface state an interaction between a spin vector and a momentum vector of a charge carrier results in these two vectors being locked perpendicular to each other. In the case of electrons, this interaction is related to the spin-orbit interaction of the electrons in the atoms making up the material. Electrical conduction involving topological surface states contrasts sharply with traditional practical electrical conduction, in which only the momentum, not the spin, plays a role.

The existence of topological surface states has been demonstrated, and their properties characterized, using various techniques, such as angle-resolved photoemission spectroscopy (ARPES), scanning tunneling microscopy, Shubnikov-de Haas oscillations and weak-field Hall effect. Topological surface states are characterized by energy bands that are distinguishable from those of the bulk material. Spin-orbit or spin-momentum interaction needs to be relatively strong for topological surface states to exist. For example, heavy elements, such as Bi and Sb, have such relatively strong interactions, and materials incorporating such elements may be expected to exhibit topological surface states. Topological surface states have been observed in stoichiometric and non-stoichiometric substances. They have been observed in substances including elements from groups 13, 14, 15, and 16 of the periodic table. They have been also observed in solid solution alloys.

Figure 1A:
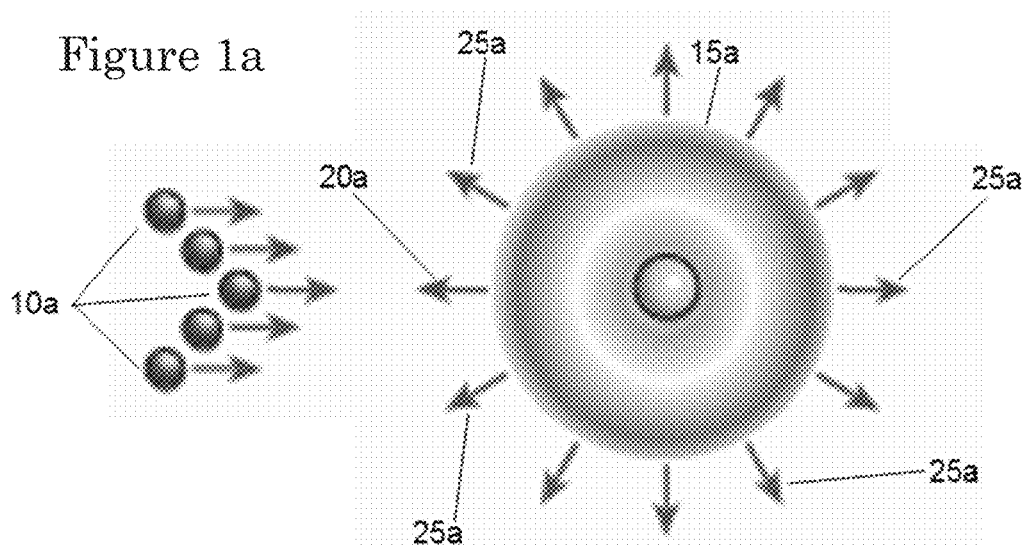
FIGS. 1a and 1b illustrate properties of topological surface states.
Figure 1B:
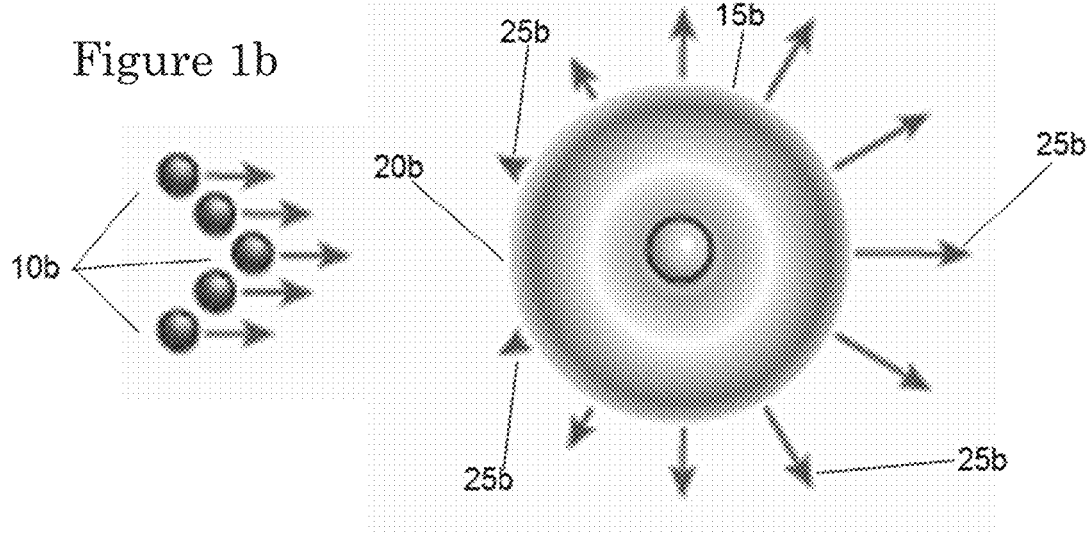

A property that distinguishes topological surface states from ordinary surface states, making them potentially advantageous for electronics applications at nanometer dimensions, is their immunity to backscattering from impurities and crystallographic defects which are present on all solid surfaces. This property gives rise to enhanced transmission of carriers in these states through energy barriers, compared to such transmission of other surface states. Impurities or defects in materials may give rise to such barriers. This enhanced transmission may be advantageous when significant surface conduction is unavoidable. The effect is illustrated in FIGS. 1a and 1b. FIG. 1a illustrates scattering by an impurity 15a of electrons 10a in a classical state, depending only on momentum. The electrons are scattered more or less uniformly in every direction, as depicted by the arrows 20a and 25a, which are all of essentially the same length. Arrow 20a indicates the particular case of 180° backscattering. FIG. 1b, by contrast, illustrates scattering by an impurity 15b of electrons 10b in a topological surface state, characterized by momentum and spin locked together. In this case, electron scattering is not uniform but depends on direction, as indicated by the varying lengths of arrows 20b and 25b. The most probable direction for electron scattering is the forward direction. Most noteworthy is the absence of scattering in the 180° backscattering direction, as shown by a missing arrow at position 20b.

The existence of topological surface states with enhanced mobility and absence of backscattering has been demonstrated experimentally. As one example, electron mobility exceeding 9000 cm$^2$/V-s in topological surface states has been measured by the inventors in $Bi_2Te_3$. The electron mobility of electrons in the bulk of the same samples has been estimated as being lower than the topological surface state mobility by about a factor of 12. Other measurements and observations in elemental antimony (Sb) by the inventors confirm that this mobility is occurring in topological surface states and that charge carriers in these states are protected against backscattering from defects. This protection from backscattering accounts, at least in part, for the relatively high surface mobility.

In another example, experiments using scanning tunneling microscopy (STM) on $Bi_{1-x}Sb_x$ (0.07≤x≤1) and Sb have demonstrated that charge carriers in topological surface states are indeed forbidden from making a transition between a state with forward momentum and a state with backward momentum, as illustrated in FIG. 1b. Protection from 180° backscattering is a direct consequence of the nature of topological surface states, which requires the backscattering to be accompanied by flipping of an electron's spin. In the absence of any magnetic impurity in the material, the topological surface state electrons have coupled spin angular momentum and crystal momentum and are said to be topologically protected.

Topological surface states, when compared to ordinary surface states, also possess the ability to transmit through a crystallographic barrier such as atomic steps with enhanced probability. This property has been demonstrated experimentally by the inventors using STM experiments on domains of crystalline Sb. The crystalline domains were configured to support current flow parallel to a [111] crystallographic surface. The results of these experiments demonstrate that crystalline steps do not necessarily confine carriers in topological surface states, unlike in typical metals (such as Au, Ag, and Cu), in which steps can confine carriers in non-topological surface states. Experiments estimate the transmission of surface electrons through crystalline steps in Sb to be 35%. In contrast, similar experiments on surface states of Cu, Au, and Ag show no such transmission.

Calculations indicate that similar protection against backscattering and enhanced surface mobilities should occur in topological surface states in the following materials and families of materials: $Bi_{1-x}Sb_x$, where 0.07≤x≤1; $Bi_{(2-2x)}Sb_{2x}Se_{(3-3y)}Te_{3y}$, where 0≤x≤1 and 0≤y≤1; $TlBiSe_{2-2x}Te_{2x}$, where 0≤x≤1; $TlSbSe_{2-2x}Te_{2x}$, where 0≤x≤1; $GeBi_2Te_4$; $GeBi_4Te_7$; a heavy metal half Heusler phase with 18 electrons per formula unit such as LuPtSb; and HgTe—CdTe layered structures.

ARPES measurements have observed signatures of topological surface states for a number of compounds with a bulk gap, the so-called topological insulators (such as $Bi_{1-x}Sb_x$ (x>0.07), $Bi_2Se_3$, $Bi_2Te_3$, $Bi_{1-x}Se_{3-x}Te_x$, $Bi_{2-x}Sb_{3-x}Te_x$, $TlBiTe_2$, $TlBiSe_2$, $GeBi_2Te_4$, and $GeBi_4Te_7$), as well as on the surface of the semimetal $Sb^{8-}$. It is has been theoretically predicted that heavy metal half Heusler phases with 18 electrons per formula unit (such as LuPtSb), as well as compounds that are composed of Tl (such as $TlSbSe_2$), may also posses topological surface states. Since most of the compounds discovered to date show a bulk band gap in ARPES measurements, these compounds are often referred to as topological insulators. The presence of defects and dopants in these compounds, however, may give rise to non-zero electrical conduction under most circumstances.

Materials with topological surface states fabricated in nanometer-scale circuits may show much superior performance as interconnects and achieve significantly lower resistance compared to Cu and other metals now conventionally used for interconnects. The inventors' demonstration that the surface state electrons are robust against scattering from defects and crystallographic imperfection illustrates this utility. In general, both metallic and semiconducting materials with topological surface states can be used for applications disclosed below.

Figure 2:
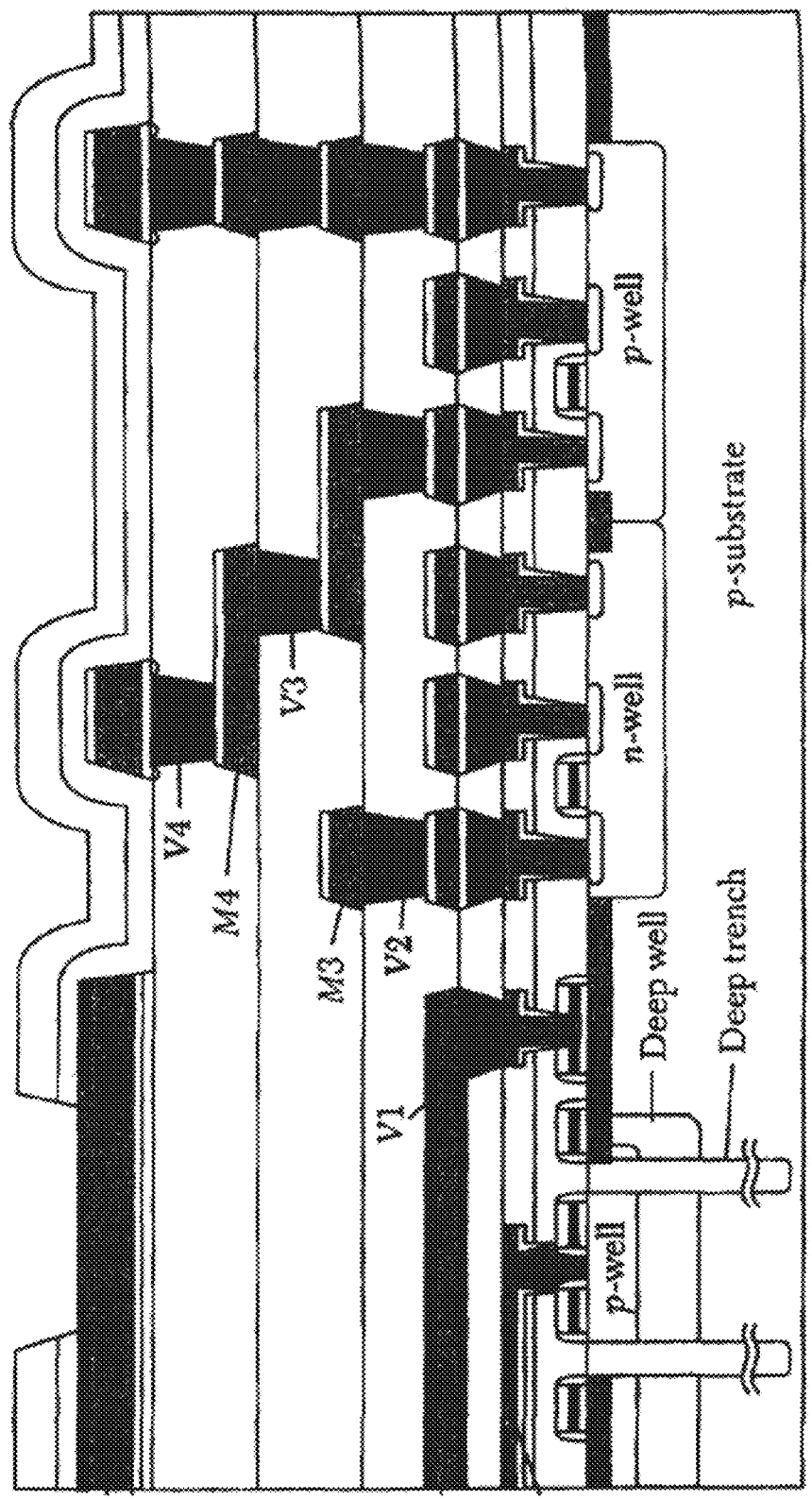
FIG. 2 shows an embodiment of an electronic circuit with multi-level interconnects.

FIG. 2 shows an example, not to be construed as limiting, of a cross-section of an integrated circuit device with interconnects fabricated from a material exhibiting electrical conduction in topological surface states. Five levels of such interconnects are shown, labeled M1, M2, M3, M4 and M5. Some of these conducting interconnects provide an electrically conducting path between devices in a plurality of devices 20. Others provide a conducting path between devices 20 and other components not shown. Connections between levels are made through vias V1, V2, V3, and V4 in dielectric layers separating the interconnect layers M1, M2, M3, M4 and M5.

In one embodiment, not to be considered limiting, interconnects such as those shown in FIG. 2 may be fabricated by fabricating a film of material with charge carriers having topological surface states and patterning the film to form the interconnect, using patterning techniques known in the art. A variety of methods may be used to fabricate materials with topological surface states. These include various methods for growing single crystals, molecular-beam-epitaxy techniques for creating thin films, and various other methods for creating nano-ribbons or small wires.

As an example of the use of crystal growth, demonstrated by the inventors, $Bi_{1-x}Sb_x$ single crystals may be grown by melting stoichiometric mixtures of elemental Bi (99.999%) and Sb (99.999%) in 4-mm inner diameter quartz tubes. The samples may be cooled over a period of two days, from 650 to 260° C., and then annealed for a week at 260° C. A single crystal of antimony from a boule grown by the modified Bridgman method may be used for various applications. Before the growth, high-purity antimony (99.999%) may be sealed in a vacuum quartz tube and heated to 700° C. The crystal growth process has been found to take about a day at a slow rate of cooling from 700 to 500° C. The boule may then be kept at 500° C. for annealing over five days. The boule may then be furnace-cooled to room temperature (25° C.).

The behavior of topological surface states may be sensitive to the position of the chemical potential (Fermi level) within the band structure of the host material. In the preparation of a material having topological surface states, dopants may be introduced into the material to move the chemical potential to a desired position, within the bulk band gap for example. As a specific example, a relatively small concentration of calcium atoms has been introduced into $BiSe_3$ to make it more p-type.

Figure 3:
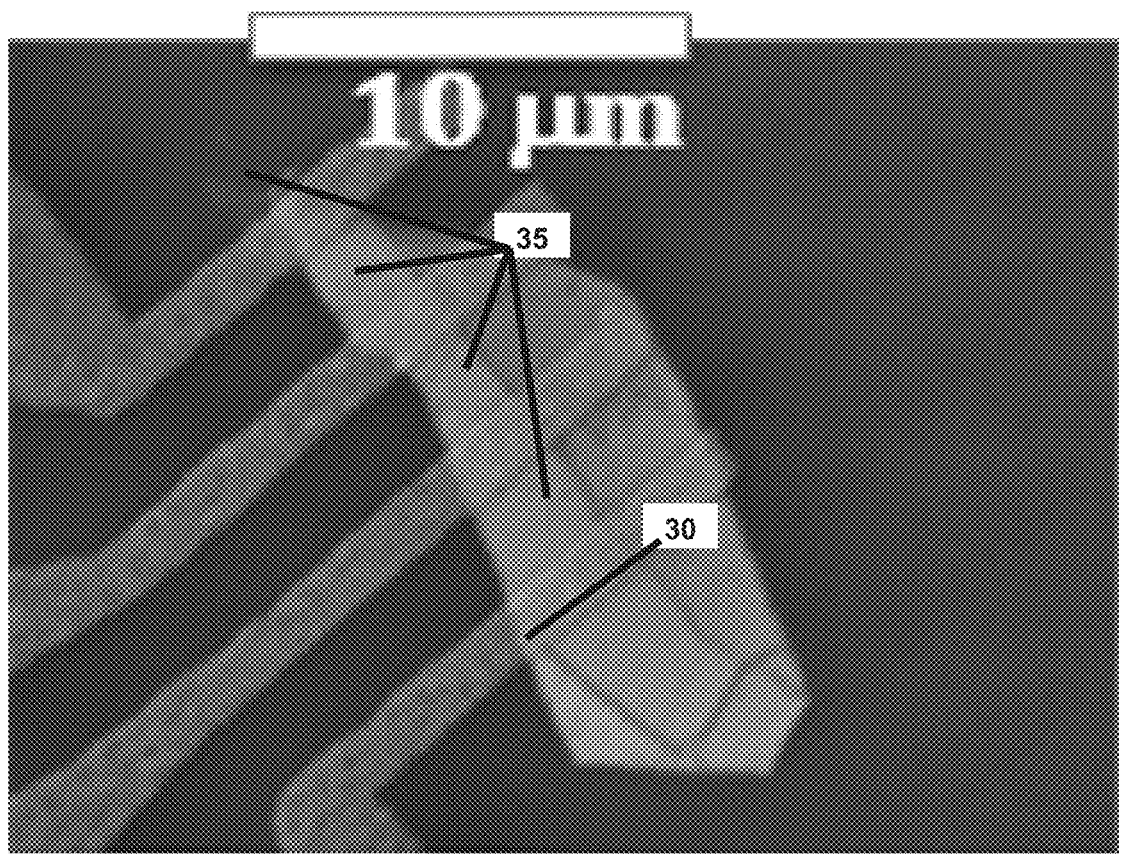
FIG. 3 shows an embodiment of a gated electronic modulation device.
Figure 4A:
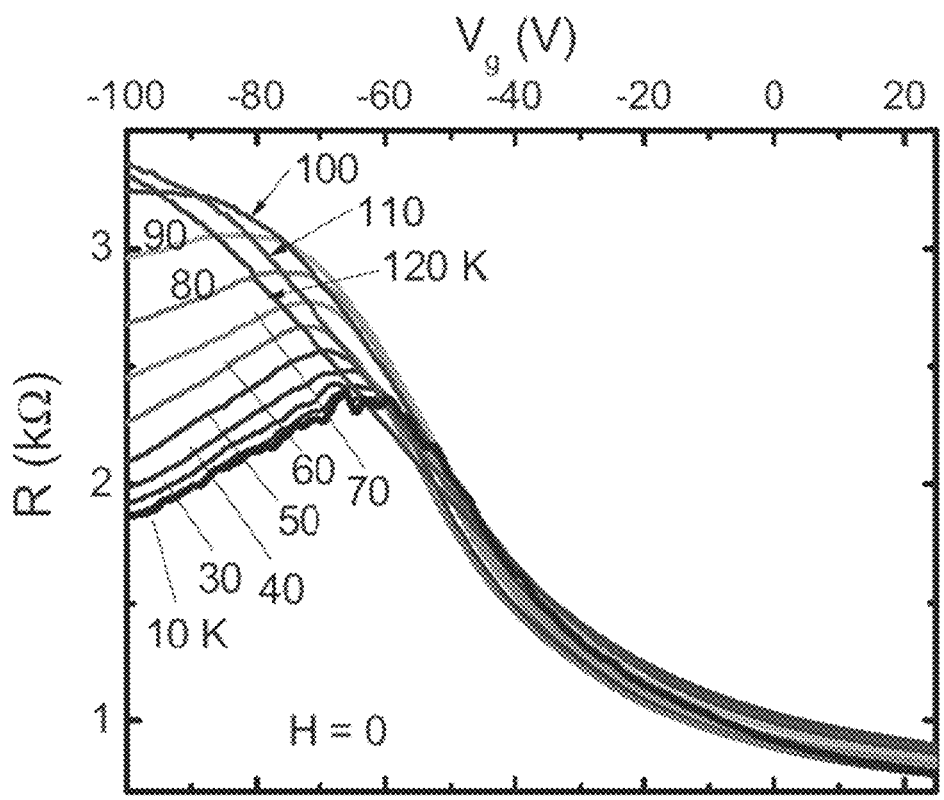
FIGS. 4a and 4b show plots of properties of the example gated electronic modulation device.
Figure 4B:
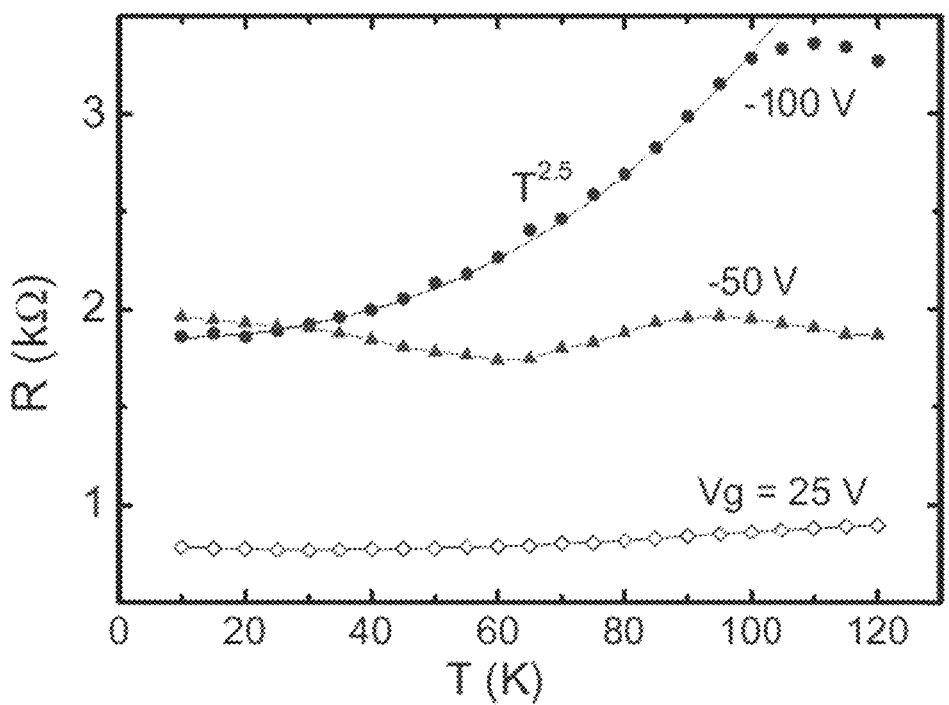
Figure 5:
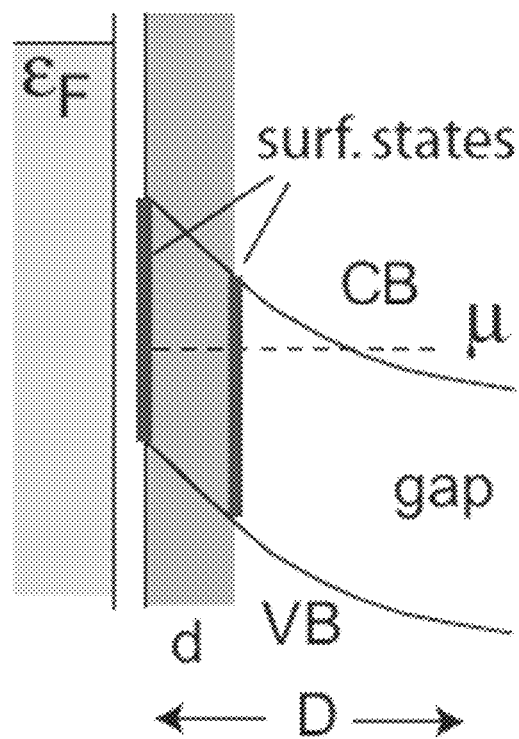
FIG. 5 is a graph showing relationship between surface states and the bulk portion.

FIGS. 3 and 4 show another example, with actual experimental results, of a device based on materials exhibiting topological surface states. It is a gated device, in which the resistivity of a material can be varied by using an applied potential to change the relative proportion of electrons moving in traditional states and in topological surface states. This device may therefore be operated as a modulation device. Modulation devices are useful in a large variety of applications such as wireless communications. As shown in FIG. 3, a small crystal of $Bi_2Te_3$ 30, a material with charge carriers having topological surface states, is connected to electrodes 35 and supported on a doped silicon substrate (not visible), that acts as a gate material. A potential may be applied to this gate. Between the silicon gate and topological surface state material is an insulating layer (not visible) that may act as a gate dielectric. As shown in FIG. 4, resistance (R) of the structure is dependent on both temperature T and applied gate potential $V_g$. At a fixed temperature the resistance may be modulated by varying the gate potential $V_g$. The device may therefore be operated as a current modulator.

It may be deduced from the data of FIG. 4 that the modulation of the resistivity by the gate potential $V_g$ occurs because varying $V_g$ changes the proportion of charged carrier transport via the topological surface states relative to charged carrier transport via bulk states in the same material. This occurs, in turn, because increasing $V_g$ moves the Fermi level (chemical potential) of the carriers from the bulk gap to the conduction band.

While several embodiments have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present embodiments. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings herein is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, the embodiments disclosed may be practiced otherwise than as specifically described and claimed. The present embodiments are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present embodiments.

What is claimed is:

1. An interconnect comprising a material configured with an essentially insulating bulk portion having topological surface states occupied with charge carriers, wherein the topological surface states and the essentially insulating bulk portion each have an electrical mobility, the electrical mobility of the topological surface states being at least 12 times greater than the electrical mobility of the essentially insulating bulk portion.

2. The interconnect of claim 1, wherein the material has a mobility for the charge carriers of at least 9000 centimeter-squared per volt-second ($cm^2/V\text{-}s$).

3. The interconnect of claim 1, wherein the material comprises a non-stoichiometric material.

4. The interconnect of claim 1, wherein the material comprises an element from column 15 of the periodic table.

5. The interconnect of claim 1, wherein the material comprises an element from column 16 of the periodic table.

6. The interconnect of claim 1, wherein the material comprises an element from column 13 of the periodic table.

7. The interconnect of claim 1, wherein the material comprises an element from column 14 of the periodic table.

8. The interconnect of claim 1, wherein the material comprises a solid solution alloy.

9. The interconnect of claim 1, wherein the material has an atomic composition $Bi_{1-x}Sb_x$, where $0.07 \leq x \leq 1$.

10. The interconnect of claim 1, wherein the material has an atomic composition $Bi_{(2-2x)}Sb_{2x}Se_{(3-3y)}Te_{3y}$, where $0 \leq x \leq 1$ and $0 \leq y \leq 1$.

11. The interconnect of claim 1, wherein the material has an atomic composition $TlBiSe_{2-2x}Te_{2x}$, where $0 \leq x \leq 1$.

12. The interconnect of claim 1, wherein the material has an atomic composition $TlSbSe_{2-2x}Te_{2x}$, where $0 \leq x \leq 1$.

13. The interconnect of claim 1, wherein the material has an atomic composition $GeBi_2Te_4$.

14. The interconnect of claim 1, wherein the material has an atomic composition $GeBi_4Te_7$.

15. The interconnect of claim 1, wherein the material comprises a heavy metal half Heusler phase with 18 electrons per formula unit.

16. The interconnect of claim 1, comprising LuPtSb.

17. The interconnect of claim 1, wherein the material comprises an HgTe—CdTe layered structure.

18. The interconnect of claim 1, wherein the material comprises domains of crystalline antimony, the domains configured to support current flow parallel to a crystallographic surface.

19. An integrated circuit comprising:
a plurality of devices; and
an interconnect providing an electrically conducting path between devices, the interconnect comprising a material configured with an essentially insulating bulk portion having topological surface states occupied with charge carriers, wherein the topological surface states and the essentially insulating bulk portion each have an electrical mobility, the electrical mobility of the topological surface states being at least 12 times greater than the electrical mobility of the essentially insulating bulk portion.

20. A gated electronic device, comprising:
a material configured with an essentially insulating bulk portion having topological surface states occupied with charge carriers, wherein the topological surface states and the essentially insulating bulk portion each have an electrical mobility, the electrical mobility of the topological surface states being at least 12 times greater than the electrical mobility of the essentially insulating bulk portion;
an insulator situated on the material; and
a gate material situated on the insulator;
wherein applying a potential to the gate material modulates a current flowing in the topological surface states of the material.

21. The device of claim 20, configured such that the applying of the potential to the gate material changes the proportion of charged carrier transport via the topological surface states relative to charged carrier transport via bulk states.

* * * * *